(12) United States Patent
Tsukagoshi et al.

(10) Patent No.: US 8,852,987 B2
(45) Date of Patent: Oct. 7, 2014

(54) METHOD OF MANUFACTURING IMAGE PICKUP DEVICE

(71) Applicant: Canon Kabushiki Kaisha, Tokyo (JP)

(72) Inventors: Yusuke Tsukagoshi, Yokohama (JP); Tadashi Sawayama, Machida (JP); Akihiro Kawano, Kawasaki (JP); Sho Suzuki, Yokohama (JP); Takehito Okabe, Atsugi (JP); Masatsugu Itahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/958,840

(22) Filed: Aug. 5, 2013

(65) Prior Publication Data

US 2014/0045292 A1 Feb. 13, 2014

(30) Foreign Application Priority Data

Aug. 7, 2012 (JP) .................................. 2012-174844

(51) Int. Cl.
*H01L 21/00* (2006.01)
*H01L 31/0232* (2014.01)
*H01L 27/146* (2006.01)

(52) U.S. Cl.
CPC .... *H01L 31/02327* (2013.01); *H01L 27/14629* (2013.01); *H01L 27/14621* (2013.01); *H01L 27/14623* (2013.01); *H01L 27/14685* (2013.01)

USPC ................... 438/65; 438/57; 438/69; 438/70; 257/215; 257/219; 257/440; 257/E21.158

(58) Field of Classification Search
CPC ...................................................... H01L 51/44
USPC ................ 257/215, 219, 292, 432, 440, 443, 257/E31.032, E21.158; 438/57, 69–70, 73, 438/675, 758
See application file for complete search history.

(56) References Cited

U.S. PATENT DOCUMENTS

2009/0166783 A1 7/2009 Maruyama

FOREIGN PATENT DOCUMENTS

| JP | 2009-164247 A | 7/2009 |
| JP | 2010-93160 A | 4/2010 |
| JP | 2010-98330 A | 4/2010 |

*Primary Examiner* — Mark A Laurenzi
(74) *Attorney, Agent, or Firm* — Canon USA Inc IP Division

(57) ABSTRACT

A method of manufacturing an image pickup device includes a step of forming a filling member such that the filling member covers a light guiding part and a peripheral part provided in a film. The light guiding part is positioned on an image pickup region of the image pickup device and has openings that correspond to respective photoelectric conversion portions. The peripheral part is positioned on a peripheral region of the image pickup device. The filling member fills in the openings. The method includes a step of processing the filling member. The method includes a step of forming light guiding members, which is performed after the step of processing filling member has been performed, by a polishing process performed on the filling member so that the light guiding part is exposed. The light guiding members are part of the filling member and disposed in the openings.

10 Claims, 6 Drawing Sheets

METHOD OF MANUFACTURING IMAGE PICKUP DEVICE

BACKGROUND OF THE INVENTION

1. Field of the Invention

The present disclosure relates to a method of manufacturing an image pickup device that has a plurality of light guiding members.

2. Description of the Related Art

It has been proposed that light guiding paths (optical waveguides) that guide light to photoelectric conversion portions are provided in image pickup devices such as complementary metal oxide semiconductor (CMOS) sensors. In an example of known methods, such light guiding paths are formed as follows. That is, a plurality of openings are initially formed in a base film formed of a silicon oxide layer, and then a silicon nitride filling member is formed as a film so as to fill in the plurality of openings. Excessive part of the filling member spread out of the openings is removed by using a chemical mechanical polishing (CMP) method. Thus, silicon nitride light guiding members have been formed.

Japanese Patent Laid-Open No. 2009-164247 discloses an image pickup device that has an effective pixel region, in which photoelectric conversion portions are arranged, and a peripheral region, which surrounds the effective pixel region. In the image pickup device, the level of an upper surface of a filling member is different between the effective pixel region and the peripheral region. Since the level is higher in the peripheral region than in the effective pixel region, in a technology disclosed in Japanese Patent Laid-Open No. 2009-164247, a dummy opening is provided in the peripheral region so as to reduce the difference in level that exists in a boundary portion between the effective pixel region and the peripheral region.

Since circuit wiring is provided in the peripheral region, it may be difficult in some cases to desirably form the dummy opening described in Japanese Patent Laid-Open No. 2009-164247. This limits the reduction of the difference in level of the upper surface of the filling member. Furthermore, such a difference in level causes a problem in particular when the filling member is removed until a base film is exposed, so that a plurality of light guiding members are formed. That is, when not only the excessive part of the filling member spread out of the openings on the image pickup region but also the filling member in the openings and the base film are removed, the length of the light guiding members becomes non-uniform in the image pickup region. Non-uniformity in the length of the light guiding members causes degradation of imaging performance such as variation in the optical interference conditions among the light guiding members.

SUMMARY OF THE INVENTION

In view of such a problem, the present technology provides an image pickup device, with which non-uniformity in the length of a plurality of light guiding members formed of a filling member is reduced and a good image is obtained.

In order to address the above-described problem, a method of manufacturing an image pickup device is proposed. The image pickup device includes a substrate and a plurality of light guiding members. The substrate has an image pickup region and a peripheral region. A plurality of photoelectric conversion portions are arranged in the image pickup region, and the peripheral region surrounds the image pickup region. The plurality of light guiding members are provided so as to correspond to the respective photoelectric conversion portions on the image pickup region. The method includes a step of forming a filling member such that the filling member covers a light guiding part and a peripheral part provided in a film. The light guiding part is positioned on the image pickup region and has a plurality of openings that correspond to the respective photoelectric conversion portions. The peripheral part is positioned on the peripheral region. The filling member fills in the plurality of openings. The method also includes a step of processing the filling member. The method also includes a step of forming the plurality of light guiding members, which is performed after the processing of the filling member has been performed, by a polishing process performed on the filling member so that the light guiding part is exposed. The plurality of light guiding members are part of the filling member and disposed in the plurality of openings. In the method, at a first point of time, which is between the forming of the filling member and the processing of the filling member, and at a second point of time, which is between the processing of the filling member and the forming of the plurality of light guiding members, the filling member has a first part positioned on the light guiding part and separated from the image pickup region by a base distance, a second part positioned on the peripheral part and separated from the peripheral region by the base distance, and a third part that is positioned between the first part and the image pickup region and fills in the plurality of openings. In the method, when $S_1$ is an area of the image pickup region, $S_2$ is an area of the peripheral region, $V_{1A}$ is a volume of the first part at the first point of time, $V_{2A}$ is a volume of the second part at the first point of time, $V_{1B}$ is a volume of the first part at the second point of time, and $V_{2B}$ is a volume of the second part at the second point of time, the following relationships, $V_{1A}/S_1 < V_{2A}/S_2$ and $V_{1B}/S_1 \geq V_{2B}/S_2$, are satisfied.

Further features of the present invention will become apparent from the following description of exemplary embodiments with reference to the attached drawings.

DESCRIPTION OF THE EMBODIMENTS

An embodiment of an image pickup device will be described below with reference to the drawings. In the following description, the same signs will denote the same components or portions throughout the drawings and redundant description thereof will be omitted.

Figure 1A:
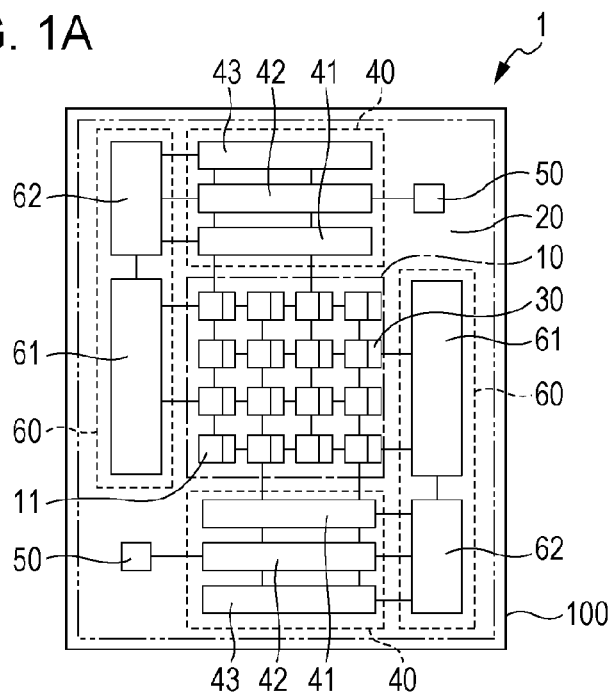
FIG. 1A is a schematic plan view of an image pickup device.

FIG. 1A is a schematic plan view of an image pickup device 1. The image pickup device 1 has an image pickup region 10 and a peripheral region 20. In FIG. 1A, a region surrounded by the one-dot chain line is the image pickup region 10 and a region defined between the one-dot chain line and the solid line, which indicates the outline of the image pickup device 1, is the peripheral region 20. A plurality of pixels 11 are arranged in a two-dimensional array in the image pickup region 10, which is irradiated with light picked up as an image. Although 16 pixels 11 are arranged in a 4×4 array in the present embodiment, a multi-million or tens of multi-million pixels 11 may actually be arranged in an array. Signal generating units 30 generate electrical signals in accordance with signal charges of the pixels 11. In the present embodiment, the signal generating units 30 are disposed in the image pickup region 10 corresponding to the pixels 11.

Referring to FIG. 1A, signal processing units 40, output units 50, and control units 60 may be provided in the peripheral region 20. The signal processing units 40 process signals generated by the signal generating units 30. The output units 50 output the signals processed in the signal processing units 40 to the outside. The control units 60 control the signal generating units 30 and the signal processing units 40. In the present embodiment, each signal processing unit 40 includes an amplifying circuit 41, a conversion circuit 42, and a horizontal scan circuit 43. The amplifying circuit 41 includes a plurality of column amplifiers. The conversion circuit 42 includes a plurality of column analog to digital (AD) converters. The horizontal scan circuit 43 selects output from the conversion circuit 42 and outputs the selected output to the output unit 50. Each output unit 50 includes electrode pads and a protection circuit. Each control unit 60 includes a vertical scan unit 61, a timing generating circuit 62, and so forth. Light shielded pixels, which include shielded photoelectric conversion portions, may be provided in the peripheral region 20. The structure of the peripheral region 20 may be appropriately designed. At least part of the signal generating unit 30 may be provided in the peripheral region 20, and at least part of the signal processing unit 40 may be provided in the image pickup region 10.

Figure 1B:
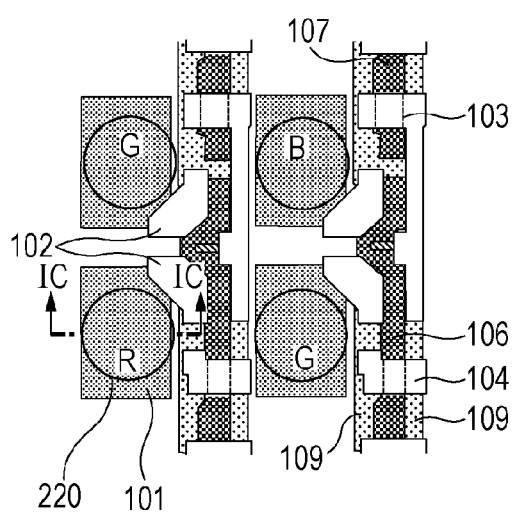
FIG. 1B is a schematic plan view of part of an image pickup region.

FIG. 1B is a schematic plan view of the image pickup region 10, illustrating an enlarged view of four pixels in a 2×2 array. The pixel 11 includes a photoelectric conversion portion 101. The signal generating unit 30 may include, for example, a transfer gate 102, a floating diffusion region 106, an amplifying transistor 103, and a reset transistor 104. The signal generating unit 30 may also include a selection transistor. These transistors may use a metal oxide semiconductor (MOS) transistor, which includes a diffusion region 107 used as a source, a drain, and a channel, and a polysilicon gate electrode. The signal generating unit 30 may be shared by a plurality of photoelectric conversion portions 101 as illustrated in FIG. 1B. Charge coupled devices (CCDs) may be provided in the image pickup region 10 so as to transfer signal charges to the peripheral region 20.

Figure 1C:
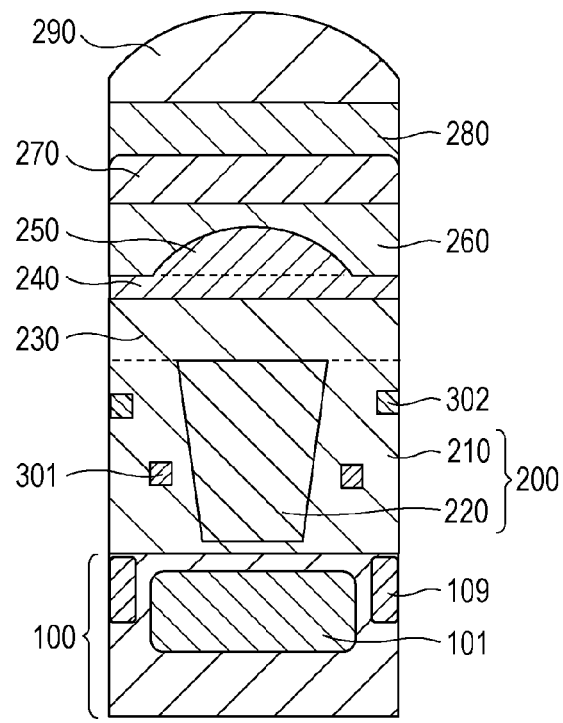
FIG. 1C is a schematic sectional view of a pixel.

FIG. 1C is a schematic sectional view of a structure illustrated in FIG. 1B taken along line IC-IC in FIG. 1B. The photoelectric conversion portion 101 is formed in a semiconductor substrate 100. The photoelectric conversion portion 101 may be a thin-film semiconductor formed on an insulating substrate. A light guiding structure 200 that includes a plurality of light guiding members 220 is provided on a surface of the semiconductor substrate 100, which serves as a light receiving surface. Furthermore, a high-refractive-index film 240, a second lens 250, a color filter 270, and a first lens 290 are provided on the semiconductor substrate 100. A first intermediate film 230 is provided between the light guiding structure 200 and the high-refractive-index film 240. The first intermediate film 230 has a lower refractive index than that of the light guiding member 220. The high-refractive-index film 240 has a higher refractive index than that of the first intermediate film 230. A second intermediate film 260 is provided between the second lens 250 and the color filter 270. The second lens 250 has a higher refractive index than that of the second intermediate film 260. A third intermediate film 280 is provided between the color filter 270 and the first lens 290. Each intermediate film may have the function of adjusting the distance between the lenses or the function of planarization.

The light guiding structure 200 includes a base film 210 and the light guiding member 220 surrounded by the base film 210. The base film 210 may be a multilayer film or a single layer film. The base film 210 of the present embodiment has low-refractive-index layers that have a lower refractive index than that of the light guiding member 220. The light guiding structure 200 guides light to the photoelectric conversion portion 101 by total reflection occurring at interfaces between the light guiding member 220 and each low-refractive-index layer. The base film 210 may include a high-refractive-index layer having a higher refractive index than that of the light guiding member 220 or an equal-refractive-index layer having a refractive index equal to that of the light guiding member 220. However, in order to effectively guide light, the sum of the thicknesses of the low-refractive-index layers included in the base film 210 can be equal to or greater than a half of the entire thickness of the base film 210.

The light guiding principle is not limited to the total reflection at the interface between the light guiding member 220 and the low-refractive-index layer. For example, light can be guided to the photoelectric conversion portion 101 by total reflection occurring between the light guiding member 220 and a low-refractive-index region, which is provided between the base film 210 and the light guiding member 220 and has a lower refractive index than the light guiding member 220. In this case, the base film 210 does not necessarily include the low-refractive-index layer having a lower refractive index than that of the light guiding member 220. The low-refractive-index region may be formed of a solid, a liquid, a gas, or vacuum.

Furthermore, the light guiding principle is not limited to total reflection. Light may be guided to the photoelectric conversion portion 101 by metallic reflection caused by a metal film provided between the base film 210 and the light guiding member 220. In this case, the base film 210 does not necessarily include the low-refractive-index layer having a lower refractive index than that of the light guiding member 220. Alternatively, the base film 210 itself may be formed of a metal film.

An outline of a method of forming the light guiding structure 200 applied to the manufacture of the image pickup device 1 is described with reference to FIGS. 2A to 2F. FIGS. 2A to 2F are schematic sectional views of the image pickup device 1 during formation of the light guiding structure 200.

Figure 2A:
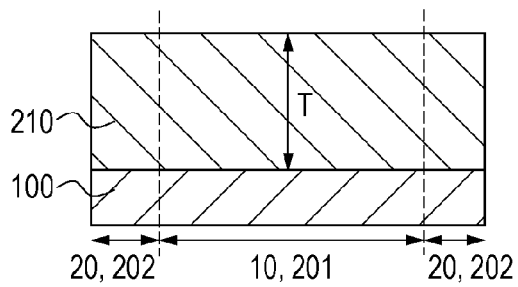
FIGS. 2A to 2F illustrate a method of forming a light guiding structure.

The semiconductor substrate 100 that includes the image pickup region 10 and the peripheral region 20 is initially prepared. The photoelectric conversion portions 101 are disposed in the image pickup region 10. A region of the semiconductor substrate 100 other than the image pickup region 10 is the peripheral region 20. When $S_1$ is the area of the image pickup region 10 and $S_2$ is the area of the peripheral region 20, the present embodiment can satisfy $S_1 < S_2$. However, the present embodiment may satisfy $S_1 \geq S_2$. The base film 210 that covers the image pickup region 10 and the peripheral region 20 is formed on the semiconductor substrate 100 (FIG. 2A). As described above, this base film 210 is a multilayer film or a single layer film. Out of the base film 210, a portion of the base film 210 that covers the image pickup region 10 is referred to as a light guiding part 201 and a portion of the base film 210 that covers the peripheral region 20 is referred to as a peripheral part 202. The thickness of the light guiding part 201 is denoted by T. The thickness T is the distance from the image pickup region 10 to an upper surface of the light guiding part 201.

Figure 2D:
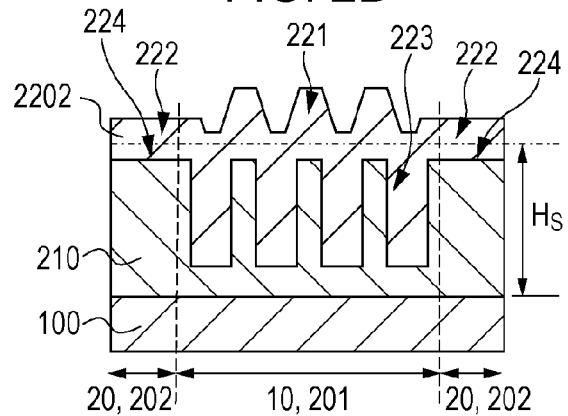
Figure 2B:
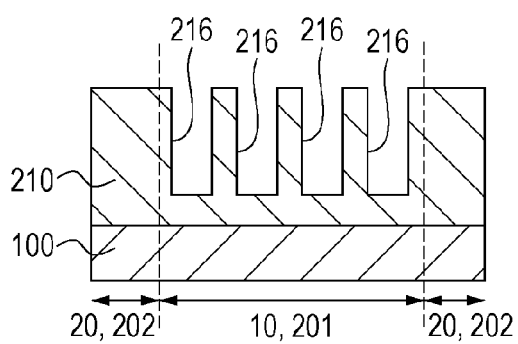

Next, a plurality of openings 216 are formed in at least in the light guiding part 201 of the base film 210 (FIG. 2B). Each of the openings 216 is formed for a corresponding one of the photoelectric conversion portions 101. The openings 216 may be through holes that penetrate through the base film 210, and the bottoms of the openings 216 are defined by the semiconductor substrate 100. Alternatively, the openings 216 may be bottomed holes that do not penetrate through the base film 210, and the bottoms thereof are defined by the base film 210. Dummy openings (not shown) may be formed in the peripheral part 202 of the base film 210. The dummy openings may also be formed, for example, in the peripheral part 202, corresponding to the light shielded pixels in the peripheral region 20.

A filling member 2201 is formed as a film on the base film 210 (FIG. 2C) so as to fill in the openings 216 (and the dummy openings). A multilayer formed of the semiconductor substrate 100 and the base film 210 functions as a base body that supports the filling member 2201. The filling member 2201 is disposed at positions away from the surface of the semiconductor substrate 100 by equal to or greater than a datum height $H_S$. The filling member 2201 has a first part 221, which corresponds to the image pickup region 10, and a second part 222, which corresponds to the peripheral region 20. $H_S$ represents the distance (base distance) between the first part 221 and the image pickup region 10 and also represents the distance between the second part 222 and the peripheral region 20. The distance $H_S$, which represents the datum height, is equal to or greater than a distance T, which represents the thickness of the base film 210. The first part 221 covers the light guiding part 201, and the second part 222 covers the peripheral part 202. The filling member 2201 also has a third part 223 and a fourth part 224. The third part 223 and the fourth part 224 are disposed on the base film 210 at positions lower than the datum height $H_S$. The third part 223 is positioned between the first part 221 and the image pickup region 10, and the fourth part 224 is positioned between the second part 222 and the peripheral region 20. The third part 223 covers the light guiding part 201, and the fourth part 224 covers the peripheral part 202. At least part of the third part 223 is positioned in the openings 216 and fills in the openings 216. The entirety of the filling member 2201 disposed in the openings 216 is the third part 223. The first part 221 is not disposed in the openings 216. Although the datum height $H_S$ is set at a position further away from the semiconductor substrate 100 than the upper surface of the base film 210 in the present embodiment, the datum height $H_S$ may be set on the upper surface of the base film 210. In this case, the third part 223 is disposed only in the openings 216, and the first part 221 is in contact with the light guiding part 201. Also in this case, the fourth part 224 is not disposed when the dummy opening are not provided, and the fourth part 224 is disposed only in the dummy opening when the dummy opening is provided.

Figure 2E:
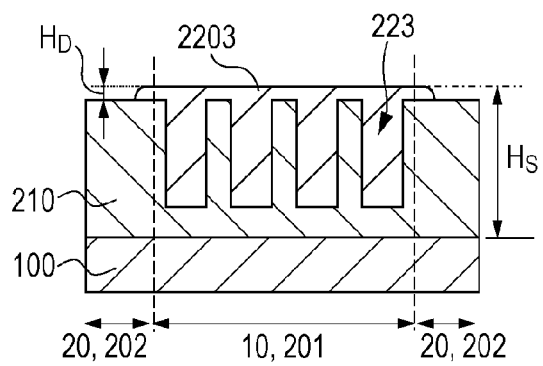
Figure 2C:
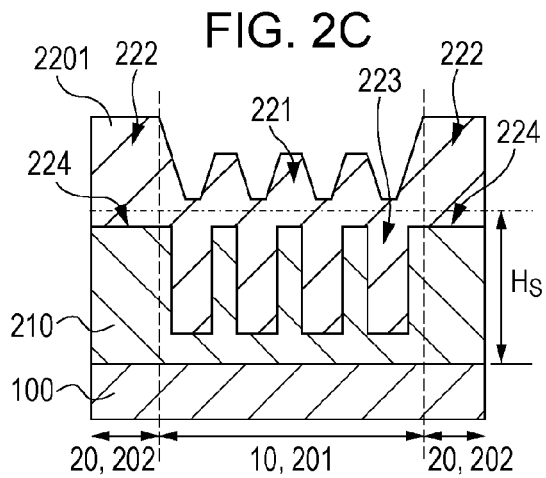

At a time the formation of the filling member 2201 as a film is completed as illustrated in FIG. 2C, when $V_{1A}$ is the volume of the first part 221, $V_{2A}$ is the volume of the second part 222, $D_{1A}=V_{1A}/S_1$ is defined as an index that represents the amount of the first part 221 per unit area for the entirety of the image pickup region 10. Likewise, $D_{2A}=V_{2A}/S_2$ is defined as an index that represents the amount of the second part 222 per unit area for the entirety of the peripheral region 20. The indices $D_{1A}$ and $D_{2A}$ correspond to average heights of the surfaces of the first part 221 and the second part 222 from the datum height $H_S$, respectively.

Here, when the filling member is formed as a film by using a typical deposition method, the density per unit area of the filling member on the image pickup region 10 is the same as that on the peripheral region 20. Part of the filling member is positioned in the openings 216 and the dummy openings. It is impractical to form the dummy openings that have the same depth and diameter as those of the openings 216 of the light guiding part 201 and that are spaced at the same interval as that of the openings 216 over the entirety of the peripheral part 202. Thus, the sum of the volumes of the openings 216 divided by the area $S_1$ is typically greater than the sum of the volumes of the dummy openings divided by the area $S_2$. With this taken into consideration, $D_{1A}<D_{2A}$ can be satisfied. That is, in the filling member 2201, with reference to the datum height $H_S$, the average height of the surface of the second part 222 is higher than the average height the surface of the first part 221.

Next, by processing the filling member 2201, at least part of the second part 222 is removed (FIG. 2D). To do this, an etching process can be adopted. Other than the etching process, a polishing process or a reflow process may be adopted for this processing. Although the etching process can be performed while the first part 221 is protected by a mask, part of the first part 221 may be removed in the etching process. At the time the etching process for the filling member 2201 is completed and a resultant filling member 2202 has been formed as illustrated in FIG. 2D, when $V_{1B}$ is the volume of the first part 221, and the $V_{2B}$ is the volume of the second part 222, $D_{1B}=V_{1B}/S_1$ is defined as an index that represents the amount of the first part 221 per unit area for the entirety of the image pickup region 10. Likewise, $D_{1B}=V_{2B}/S_2$ is defined as an index that represents the amount of the second part 222 per unit area for the entirety of the peripheral region 20. The indices $D_{1B}$ and $D_{2B}$ correspond to average heights of the surfaces of the first part 221 and the second part 222 with respect to the datum height $H_S$, respectively.

The etching process is performed such that, when the relationship $D_{1A}<D_{2A}$ is satisfied with respect to the filling member 2201 not having undergone the etching process, the relationship $D_{1B\geq D2B}$ is satisfied with respect to the filling member 2202 having undergone the etching process. That is, in the filling member 2202, with reference to the datum height $H_S$, the average height of the surface of the second part 222 is equal to or lower than the average height of the surface of the first part 221. The relationships $D_{1A}\geq D_{1B}$ and $D_{2A}>D_{2B}$ are naturally satisfied. In the filling member 2202 having undergone the etching process, the relationship $D_{1B}\geq D_{2B}\geq D_{1B}/2$ can be satisfied.

Next, a polishing process is performed on the filling member 2202 so as to remove the first part 221 and the second part 222 (FIG. 2E). The polishing process may be a chemical mechanical polishing process (CMP process). Alternatively, a mechanical polishing process may be used. By removing the first part 221 from the filling member 2202, a filling member 2203, the surface of which is positioned at the datum height $H_S$, is obtained. In the present embodiment, at the time the datum height $H_S$ is reached, part of the third part 223 remains at positions outside the openings 216. At least part of the fourth part 224 is also removed. A difference in level $H_D$, which is the difference between the level of the upper surface of the peripheral part 202 and the level of an upper surface of part of the third part 223 positioned outside the openings 216 can be expressed as $H_S-T$. At this time, when $D_{1B}>D_{2B}\geq D_{1B}/2$ is satisfied, the peripheral part 202 of the base film 210 can be exposed as illustrated in FIG. 2E. The polishing rate in the polishing process is reduced when the amount of the filling member per unit area is increased. Thus, with regard to the first part 221 and the second part 222, the second part 222 can be removed earlier.

Figure 2F:
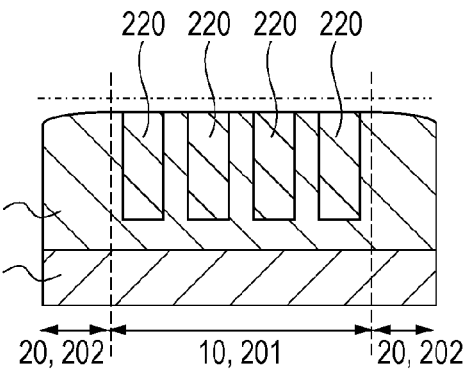

The polishing process is further performed on the filling member 2203, so that part of the third part 223 is removed. By doing this, the upper surface of the light guiding part 201 of the base film 210 is exposed. As described above, in the base film 210, both the light guiding part 201 and the peripheral part 202 are exposed. Thus, the plurality of light guiding members 220, which are independent of one another, can be formed on the image pickup region 10 (FIG. 2F).

When $D_{1B} \geq D_{2B}$ is satisfied, the peripheral part 202 tends to be exposed before the light guiding part 201 is exposed. However, when $D_{1B}=D_{2B}$, in the base film 210, the light guiding part 201 and the peripheral part 202 may be simultaneously exposed. Even when $D_{1B}>D_{2B}$, in the base film 210, the light guiding part 201 and the peripheral part 202 may be simultaneously exposed. In the base film 210, the part of the peripheral part 202 that is removed in the present embodiment is not necessarily removed.

Figure 3A:
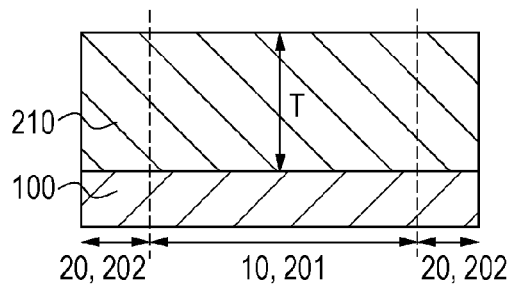
FIGS. 3A to 3F illustrate another method of forming the light guiding structure.
Figure 3D:
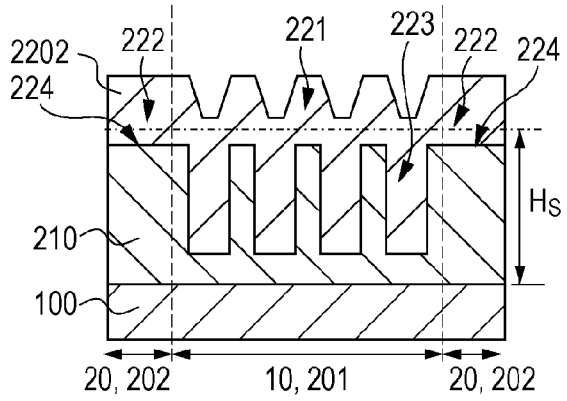
Figure 3B:
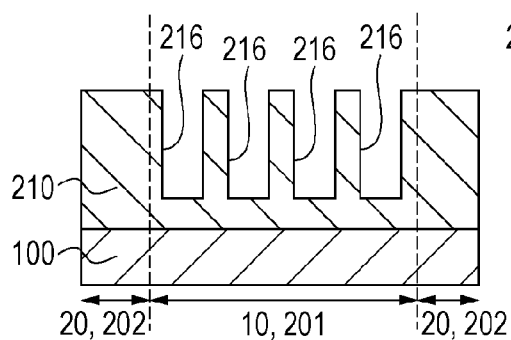
Figure 3E:
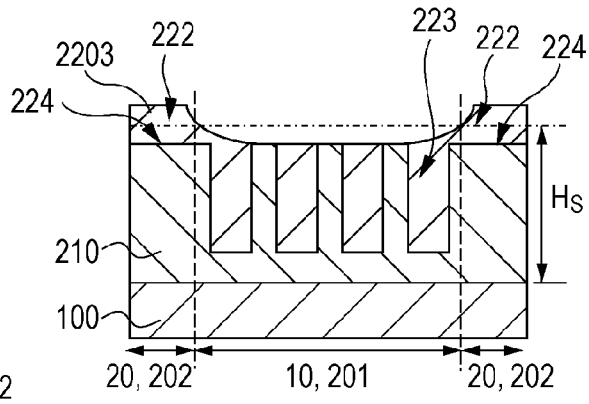
Figure 3C:
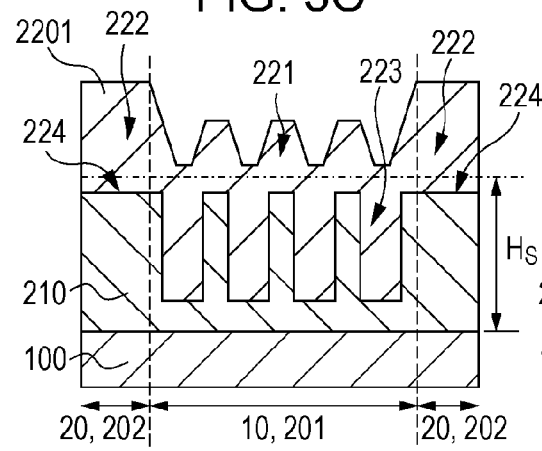

Referring to FIGS. 3A to 3F, a method of forming the light guiding structure 200 different from the method illustrated in FIGS. 2A to 2F is described. FIGS. 3A to 3F correspond to FIGS. 2A to 2F. Since the FIGS. 3A, 3B, and 3C are respectively the same as FIGS. 2A, 2B, and 2C, description thereof is omitted.

Referring to FIG. 3D, as is the case with FIG. 2D, the filling member 2201 is subjected to the etching process, in which at least part of the second part 222 is removed. However, compared to the case illustrated in FIG. 2D, the amount by which the second part 222 is removed is reduced in the case illustrated in FIG. 3D. In FIG. 3D, the processed filling member 2202 satisfies the relationship $D_{1B}<D_{2B}<D_{2A}$. A polishing process is performed on the filling member 2202 so as to remove the first part 221 and the second part 222. In the present embodiment, the third part 223 is removed and, as a result, the light guiding part 201 is exposed. The polishing rate in the polishing process is reduced when the amount of the filling member per unit area is increased. Thus, with regard to the first part 221 and the second part 222, the first part 221 can be rapidly removed. This tendency is more clearly observed in the case where $S_1<S_2$.

The polishing process is performed on the filling member 2203 so as to remove the second part 222 and the fourth part 224. At the time the polishing process is performed on the filling member 2203, the light guiding part 201 of the base film 210 is exposed. Thus, when the second part 222 and the fourth part 224 are removed, the third part 223 in the openings 216 and the light guiding part 201 of the base film 210 are also subjected to the polishing process. This may cause variation in the length of the light guiding members 220. Such variation may lead to the difference in the degree of optical interference among the light guiding members 220, and accordingly, cause unevenness of color within an image.

As described above, by performing the polishing process in a state in which the index $D_{1B}$ is greater than the index $D_{2B}$, variation in the light guiding members 220 can be reduced. Furthermore, in the base film 210, by exposing the light guiding part 201 at the same time as the peripheral part 202 or after the peripheral part 202 has been exposed, variation in the light guiding members 220 can be reduced. As described above, since it is difficult to satisfy $D_{1B} \geq D_{2B}$ only with the dummy openings, the etching process can be performed on the second part 222.

EXAMPLE

Next, a specific example of a method of manufacturing the image pickup device 1 will be described with reference to FIGS. 4A to 5F. FIGS. 4A to 4C and 5D to 5F are schematic sectional views of the image pickup device 1 in different steps.

The image pickup device 1 includes the semiconductor substrate 100. Among members of the image pickup device 1 as a semiconductor device, the semiconductor substrate 100 serves as a semiconductor portion. The semiconductor substrate 100 includes, for example, a substrate that has impurity regions formed in a semiconductor wafer by using a known semiconductor manufacturing process. The semiconductor substrate 100 may use a known semiconductor substrate, examples of which include a silicon substrate such as a silicon-on-insulator (SOI) substrate and a substrate in which an epitaxial layer is formed on a single-crystal body or substrate. A surface 1001 of the semiconductor substrate 100 serves as the interface between the semiconductor substrate 100 and an electrical insulator or conductor. Examples of the electrical insulator include a thermal silicon oxide film or the like that is disposed on and in contact with the semiconductor substrate 100.

In the present example, the semiconductor substrate 100 has p-type semiconductor regions and n-type semiconductor regions. Also in the present example, the surface 1001 is the interface between the semiconductor substrate 100 and a thermal silicon oxide film (not shown) stacked on the semiconductor substrate 100. The semiconductor substrate 100 has the image pickup region 10 and the peripheral region 20. The image pickup region 10 includes a plurality of pixels, and the peripheral region 20 includes signal processing circuits that process electrical signals from the pixels. In the present example, the area $S_2$ of the peripheral region 20 is equal to or greater than one and a half times the area $S_1$ of the image pickup region 10.

Step a: In a step a illustrated in FIG. 4A, the base film 210 is formed on the semiconductor substrate 100. The step a is specifically described below.

In the semiconductor substrate 100, p-type semiconductor regions and the n-type semiconductor regions are formed. Gate insulating films, gate electrodes, and wiring are formed on the semiconductor substrate 100. In the image pickup region 10, the photoelectric conversion portions 101, the transfer gates 102, the floating diffusion regions 106, the amplifying transistors 103, and the reset transistors (not shown) are formed. The photoelectric conversion portion 101 uses, for example, a photodiode. The photoelectric conversion portion 101 includes the n-type semiconductor region disposed in the semiconductor substrate 100. Electrons as signal charges generated by photoelectric conversion are collected into the n-type semiconductor region of the photoelectric conversion portion 101, in which the electrons are the majority charge carriers. The floating diffusion region 106 is the n-type semiconductor region. Electrons generated in the photoelectric conversion portion 101 are transferred to the floating diffusion region 106. The floating diffusion region 106 is electrically connected to an input node of an amplifying unit. In the present example, the floating diffusion region 106 is electrically connected to the gate electrode of the amplifying transistor 103 through a plug 300. Diffusion regions 108 for peripheral transistors are formed in the peripheral region 20 of the semiconductor substrate 100. Source and drain regions for the peripheral transistors, which are included in the signal processing circuits, are formed in the diffusion regions 108 for the peripheral transistors. The semiconductor substrate 100 may have element isolation regions 109. The element isolation regions 109 electrically isolate individual pixel transistors or the individual peripheral transistors from other elements. The element isolation regions 109 use shallow trench isolations (STIs). Alternatively, the element isolation regions 109 may be formed by a local oxidation of silicon (LOCOS) process.

Also in this step, a first protective layer 2111 and a second protective layer 2112 are formed on the semiconductor substrate 100. For example, the first protective layer 2111 is a silicon nitride layer and the second protective layer 2112 is a silicon oxide layer. One or both of a silicon oxide layer and a silicon nitride layer may be additionally provided between the first protective layer 2111 and the semiconductor substrate 100. The first protective layer 2111 and the second protective layer 2112 may have a function of reducing damage to the photoelectric conversion portions 101 caused in a later step. The first protective layer 2111 and the second protective layer 2112 may have an antireflective function. The first protective layer 2111 and the second protective layer 2112 may have a function of preventing metal from being contaminated in a silicide process. A third protective layer 2113 is formed on a side of the second protective layer 2112 opposite to the semiconductor substrate 100 side. The third protective layer 2113 is a silicon nitride film formed over the entire surface of the semiconductor substrate 100 and patterned so as to correspond to the individual photoelectric conversion portions 101. The area of a piece of the third protective layer 2113 can be larger than the area of the base of a corresponding one of the openings 216, which will be formed later. At least one of the first protective layer 2111, the second protective layer 2112, and the third protective layer 2113 may be omitted. A peripheral protective layer 212 is formed on the peripheral region 20.

Furthermore, a plurality of interlayer insulating layers 2131, 2132, 2133, 2134, and 2135 are formed in order from a layer closer to the semiconductor substrate 100. The interlayer insulating layers 2131 to 2135 are formed of, for example, silicon oxide. The interlayer insulating layers 2131 to 2135 can function as low-refractive-index layers that surround the light guiding members 220 of the light guiding structure 200.

In this process, contact plugs 300, a first wiring layer 301 and a second wiring layer 302 are formed. The contact plugs 300 are formed after contact holes are formed in the interlayer insulating layer 2131. In the present example, the contact plugs 300 are formed of tungsten. Next, the interlayer insulating layer 2132, the first wiring layer 301, the interlayer insulating layer 2133, the interlayer insulating layer 2134, and the second wiring layer 302 are formed in this order. In the present example, the first wiring layer 301 and the second wiring layer 302 are formed of copper. The first wiring layer 301 is formed by a single damascene method, and the second wiring layer 302 is formed by a dual damascene method. Alternatively, when the wiring layers are formed of aluminum, the wiring can be formed by using a known etching process. A plurality of silicon nitride layers 214 are formed between the interlayer insulating layers 2131 to 2135. Each of the silicon nitride layers 214 functions as an anti-diffusion layer or a etch stop layer. The silicon nitride layers 214 have a refractive index equal to or higher than that of the light guiding member 220. The silicon nitride layers 214 are each formed to have a sufficiently small thickness compared to a low-refractive-index layer. The silicon nitride layer serving as an anti-diffusion layer or an etch stop layer may be substituted by a silicon carbide layer. A planarization process is performed on each layer according to need by using the CMP method or the like.

Next, a reference layer 215 is formed on the interlayer insulating layer 2135. The material of the reference layer 215 can be selected such that, in the polishing process, the polishing rate of the reference layer 215 is lower than the polishing rate of the filling member for the openings 216, which will be disposed in a later step. As such a material of the reference layer 215, a carbon-containing silicon oxide or a carbon-containing silicon nitride can be used in the case where the CMP process is performed in the polishing process using silica slurry. A silicon oxide layer, a silicon nitride layer, or a silicon carbide layer can be used as the reference layer 215. Thus, the base film 210 has been formed. The base film 210 is a multilayer film, the uppermost layer of which is the reference layer 215. Although the reference layer 215 can be the uppermost layer of the multilayer film and serve as the upper surface of the base film 210, the reference layer 215 is not necessarily the uppermost layer. The thickness of the base film 210 that includes layers from the protective layer 2111 to the reference layer 215 is denoted by T.

Step b: In a step b illustrated in FIG. 4B, the plurality of openings 216 are formed in the light guiding part 201 of the base film 210 from the upper surface of the base film 210. The openings 216 are formed at positions superposed with the plurality of photoelectric conversion portions 101. An etching mask pattern (not shown) is initially stacked on the base film 210 on the side of the base film 210 opposite to the semiconductor substrate 100. The etching mask pattern has openings corresponding to the openings 216. The etching mask pattern is, for example, a photoresist patterned by photolithography. Next, with the etching mask pattern used as a mask, at least the reference layer 215 is etched, and furthermore, the plurality of interlayer insulating layers 2131 to 2135 and the plurality of anti-diffusion layers 214 are etched. By doing this, the openings 216 are formed. The openings 216 may be formed by a plurality of times of etching performed under different conditions. After the etching has been performed, the etching mask pattern may be removed. In the case where the third protective layer 2113 is provided, the etching can be performed in the process illustrated in FIG. 4B until the third protective layer 2113 is exposed. The etching rate of the third protective layer 2113 can be lower than the etching rate of the interlayer insulating layer 2131, which is formed on the third protective layer 2113. In the case where the interlayer insulating layer 2131 is a silicon oxide layer, it is sufficient that the third protective layer 2113 be a silicon nitride layer or a silicon oxynitride layer. The third protective layer 2113 may be exposed by a plurality of times of etching performed under different conditions.

Regarding the sectional shape of the openings 216, the openings 216 are not necessarily penetrate through all the interlayer insulating layers 2131 to 2135. The interlayer insulating layers 2135, 2134, 2133, and 2132 may define the side surface of the openings 216 and the interlayer insulating layer 2131 may define the bottom surface of the openings 216. Regarding the shape of the openings 216 in plan view, the boundary of each opening 216 has a closed loop shape such as a circle or a polygon. Alternatively, the openings 216 may have groove-like shape in plan view that extends along the plurality of photoelectric conversion portions 101. That is, the base film 210 has the opening 216 when, on a plane parallel to the surface 1001, a region in which the base film 210 is not provided is surrounded by a region or interposed between regions in which the base film 210 is provided.

Regarding the positions of the openings 216 in a plane, at least part of each opening 216 is superposed with a corresponding one of the photoelectric conversion portions 101 in plan view. That is, when one of the openings 216 and a corresponding one of the photoelectric conversion portions 101 are projected onto a single plane, there is a region in which the projection of the opening 216 and the projection of the photoelectric conversion portion 101 exist on the single plane. The interval at which the openings 216 and the photoelectric conversion portions 101 are arranged is, for example, equal to or smaller than 2 μm.

In the present example, the openings 216 are formed in regions superposed with the photoelectric conversion portions 101. The openings 216 are not formed in the peripheral region 20. However, openings may be formed in the peripheral region 20. Such openings are dummy openings because they do not guide light that contributes to imaging. In this case, density of the openings 216 formed in the light guiding part 201 may be higher than that of the dummy openings formed in the peripheral part 202. The density of the openings can be determined by the number of the openings 216 or the dummy openings provided per unit area. The density of the openings 216 can be alternatively determined by the ratio of the area occupied by the openings 216.

Step c: In a step c illustrated in FIG. 4C, the filling member 2201 that fills in the plurality of openings 216 is formed as a film on the base film 210. The filling member 2201 covers the light guiding part 201 and the peripheral part 202. The filling member 2201 can be formed by depositing a filling material by using a method such as a chemical vapor deposition (CVD) method or a sputtering method. The filling member 2201 can also be formed of an organic material by using a coating method such as spin coating. The filling member 2201 may be formed through a plurality of steps or may be formed of a plurality of materials. For example, when the filling member 2201 is formed, in a preceding step, either or both of the material and the conditions can be selected so as to improve the adherence of the filling member 2201 to the underlying material, and either or both of the material and conditions can be selected so as to allow the filling member 2201 to more easily fill in the openings 216 in a following step. Also in the step c, in the case where the first interlayer insulating layer 2131 is etched until the third protective layer 2113 is exposed, the filling member 2201 can be in contact with the third protective layer 2113.

It is sufficient that the material of the filling member 2201 have a higher refractive index than those of at least one of the layers of the base film 210, for example, the interlayer insulating layers 2131 to 2135. When the interlayer insulating layers 2131 to 2135 are formed of a silicon oxide having a refractive index of 1.4 to 1.6, the material of the filling member 2201 may be a silicon nitride layer having a refractive index of 1.7 to 2.3. The filling member 2201 is not necessarily formed of an inorganic material. The filling member 2201 may be formed of an organic material. The filling member 2201 may be formed of an organic material containing dispersed inorganic particles. The refractive indices of the materials can be appropriately set by adjusting the types, contents, composition ratios, and the film densities of impurities. Also, by increasing the hydrogen content of silicon nitride, dangling bond of a substrate can be terminated due to a hydrogen supply effect. This can reduce noise such as white flaws. The material of the filling member 2201 can be appropriately selected with consideration of optical characteristics such as the difference in refractive index and ease of manufacture.

Here, the positional relationships among the plurality of interlayer insulating layers 2131 to 2135 and the filling member 2201 disposed in the openings 216 are described. In a plane, a region where the filling member 2201 is provided is surrounded by a region or interposed between regions where the plurality of interlayer insulating layers 2131 to 2135 are provided. In other words, the first part of the plurality of interlayer insulating layers 2131 to 2135, the second part of the plurality of interlayer insulating layers 2131 to 2135, the second part being different from the first part, and portions of the filling member 2201 disposed in the openings 216 are arranged in a direction that intersects a direction in which each photoelectric conversion portion 101 and the filling member 2201 disposed in a corresponding one of the openings 216 are arranged. The direction that intersects the direction in which each photoelectric conversion portion 101 and the filling member 2201 disposed in a corresponding one of the openings 216 are arranged is, for example, a direction parallel to the surface 1001 of the semiconductor substrate 100.

The filling member 2201 is disposed at positions on the semiconductor substrate 100, the positions being superposed with the photoelectric conversion portions 101. The filling member 2201 is surrounded by the plurality of interlayer insulating layers 2131 to 2135. The material of the filling member 2201 can have a higher refractive index than those of the plurality of interlayer insulating layers 2131 to 2135. With such relationships of the refractive indices, out of light incident upon the filling member 2201, the amount of light that leaks to the plurality of interlayer insulating layers 2131 to 2135 can be reduced. Accordingly, when at least part of the filling member 2201 is superposed with the photoelectric conversion portions 101, the amount of light incident upon the photoelectric conversion portions 101 can be increased.

The filling member 2201 does not necessarily have a higher refractive index than those of the plurality of interlayer insulating layers 2131 to 2135. The filling member 2201 sufficiently functions as the light guiding member 220 of the light guiding structure 200 when the filling member 2201 has a structure in which light incident upon the filling member 2201 does not easily leak to the surrounding base film 210. For example, light reflecting films may be formed on the side walls of the openings 216. Alternatively, low-refractive-index films, which have a lower refractive index than that of the filling member 2201, may be formed on the side walls of the openings 216, so that light is introduced by total reflection at the interface between the filling member 2201 and each low-refractive-index film. Alternatively, vacuum spaces or gaps filled with a gas may be formed between the portions of the filling member 2201 disposed in the openings 216 and the plurality of interlayer insulating layers 2131 to 2135. The gaps each function as a low-refractive-index region as is the case with the above-described low-refractive-index film. As described above, when total reflection at the interface between the filling member 2201 and the low-refractive-index layers of the base film 210 is not utilized, which one of the refractive indices of the material of the filling member 2201 and the material of the base film 210 is higher than the other does not matter.

In the present example, the datum height is set in a plane that includes the upper surface of the reference layer 215. That is, the datum height $H_S$ coincides with the thickness T of the base film 210. The filling member 2201 includes the first part 221, the second part 222, and the third part 223. The first part 221 is positioned on part of the reference layer 215 on the light guiding part 201. The second part 222 is positioned on part of the reference layer 215 on the peripheral part 202. The third part 223 is positioned in the openings 216. The first part 221 is in contact with the reference layer 215. The first part 221 further includes part of the filling member 2201 positioned on the third part 223. In the case where the dummy openings are provided in the peripheral part 202, the filling member 2201 can include the fourth part 224 illustrated in FIG. 2C.

In the present example, the dummy openings (not shown) having the same shape as that of the openings 216 are formed in the light shielded pixel portions and are not provided in other peripheral circuit portions. Thus, the filling member 2201 is formed as a film such that $V_{1A}/S_1 < V_{2A}/S_2$ is satisfied where $S_1$ is the total area of the image pickup region 10, $V_{1A}$ is the total volume of the filling member 2201 disposed above the reference layer 215 in the image pickup region 10, $S_2$ is the total area of the peripheral region 20, and $V_{2A}$ is the total volume of the filling member 2201 disposed above the reference layer 215 in the peripheral region 20.

Examples of the method of measuring the volume of the filling member disposed above the reference layer 215 are as follows. The section of the first part 221 is observed so as to analyze the shape of the filling member. The volume of the first part 221 is calculated in accordance with the analyzed shape. When the shape is analyzed in a plurality of sections, the precision with which the volume of the first part 221 is calculated can be improved. As for the portion disposed in the peripheral region 20, the volume can be calculated by measuring the thickness of the flat portion of the filling member by using spectroscopic ellipsometry. Other than the above-described methods, it is also possible that the difference between the sums of the volumes of the openings 216 and the dummy openings can be regarded as the difference between the volumes of the first part 221 and the second part 222. The volume of each opening 216 can be approximated by the product of the diameter and depth of the opening 216. The area $S_2$ of the peripheral region 20 is given by $S_2=S-S_1$ where S is the area of the chip.

Step d: In a step d illustrated in FIG. 5D, a portion of the filling member 2201 positioned on the peripheral part 202 is removed by an etching process. Although dry etching such as plasma etching can be used in the etching process, wet etching may instead be used. An etching mask (not shown) is initially stacked on the filling member 2201. The etching mask has a pattern, for example, that covers at least part of the first part 221 and that does not cover at least part of the second part 222. Next, with this etching mask, at least part of the second part 222 of the filling member 2201 is removed by etching. The part of the filling member 2201 to be removed is described below when the part of the filling member 2201 is seen in plan view and in the depth direction.

At least part of the second part 222 is removed in plan view. The second part 222 can be subjected to the etching process in a region equal to or greater than a half of the second part 222 (the area equal to or greater than $S_2/2$ where $S_2$ is the area of the peripheral region 20). The entirety of the second part 222 can be subjected to the etching process. In the present example, out of the filling member 2201, a portion of the filling member 2201 disposed in the peripheral region 20 are entirely etched. In other words, no etching mask is provided over the peripheral region 20. As described above, the area subjected to etching can be large. Alternatively, only part of a portion of the filling member 2201 disposed in the peripheral region 20 can be etched. Also in this step, part of a portion of the filling member 2201 disposed in the image pickup region 10 may be removed.

In the present example, the filling member 2202 is formed by the etching process such that $V_{1B}/S_1 \geq V_{2B}/S_2$ is satisfied where $S_1$ is the total area of the image pickup region 10, $V_{1B}$ is the total volume of the filling member 2202 disposed above the reference layer 215 in the image pickup region 10, $S_2$ is the total area of the peripheral region 20, and $V_{2B}$ is the total volume of the filling member 2202 disposed above the reference layer 215 in the peripheral region 20.

Figure 5D:
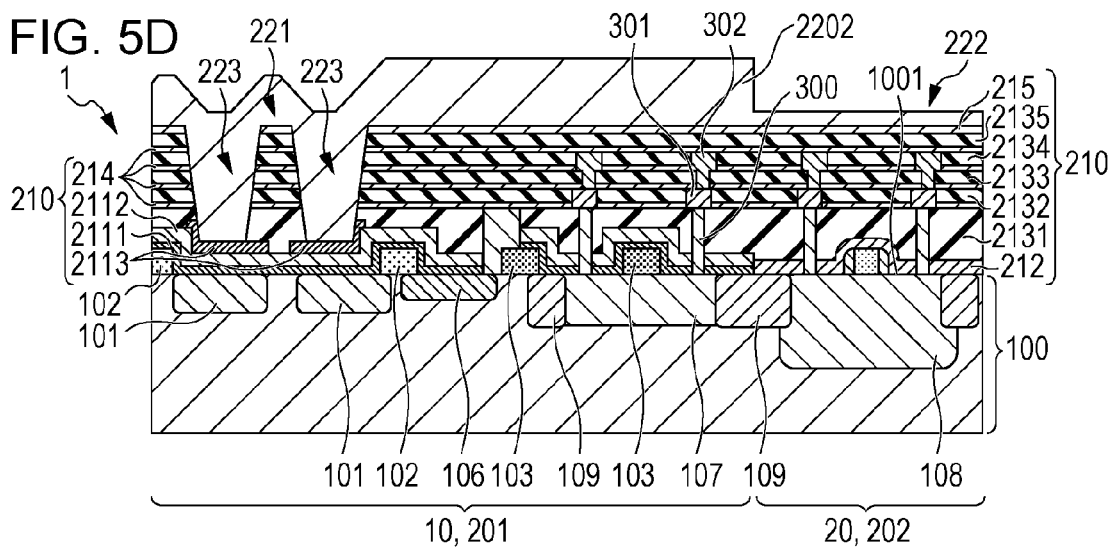
FIGS. 5D to 5F illustrate the method of manufacturing the image pickup device.
Figure 5E:
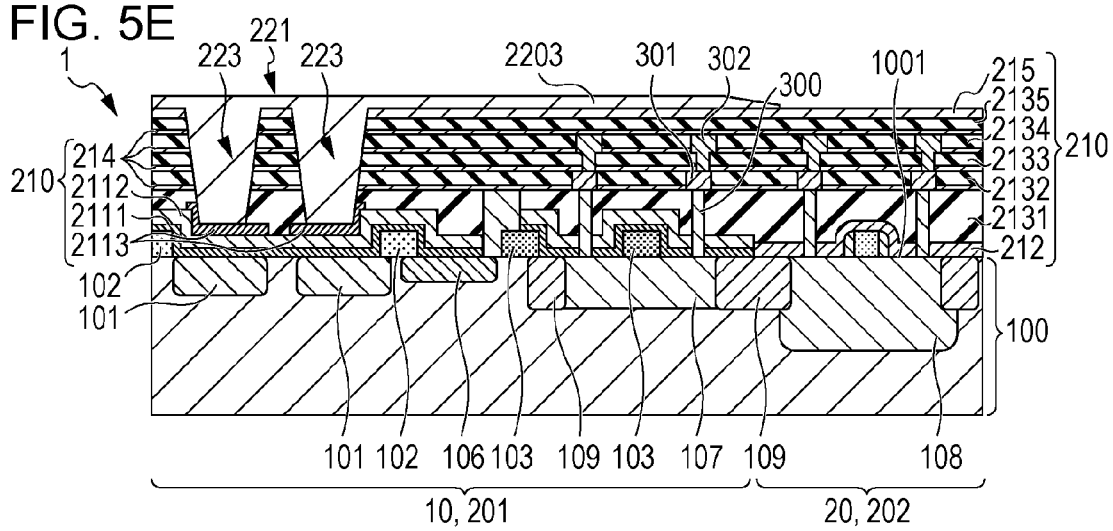
Figure 5F:
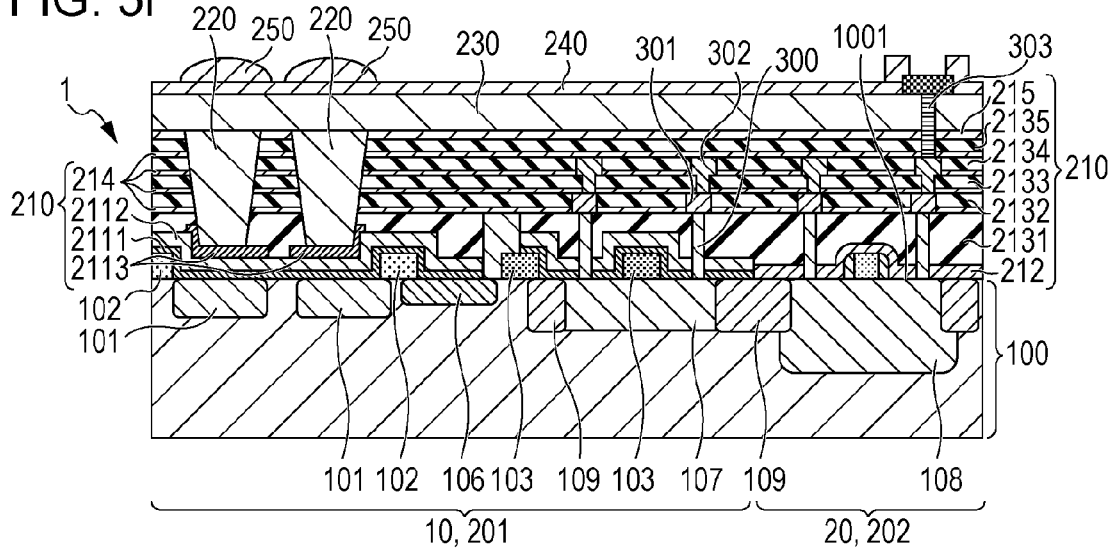

Step e: In a step e illustrated in FIG. 5E, the polishing process is performed on the filling member 2202 and a portion of the filling member 2202 positioned on the peripheral part 202 is removed by the polishing process. FIG. 5E illustrates an intermediate step of the polishing process after the polishing process has been started with $V_{1B}/S_1 \geq V_{2B}/S_2$ satisfied. The peripheral part 202 is exposed and the filling member 2203 remains on the light guiding part 201. The polishing process is completed in a state in which the light guiding part 201 is exposed. The polishing process can be completed at the time the reference layer 215 is exposed or the reference layer 215 that has been exposed remains. Alternatively, the polishing process may be completed at the time the reference layer 215 has been removed and the interlayer insulating layer 2135 is exposed. Thus, the plurality of light guiding members 220 are arranged on the image pickup region 10. The light guiding members 220 are arranged at an interval of, for example, equal to or smaller than 2 μm.

Step f: In a step f illustrated in FIG. 5F, optical, chemical, mechanical, and electrical structures are appropriately formed on the light guiding structure 200. For example, in a step illustrated in FIG. 5F, the first intermediate film 230, a third wiring layer 303, and the interlayer lenses 250 are formed. After that, color filters, microlenses, and so forth are formed.

Figure 3F:
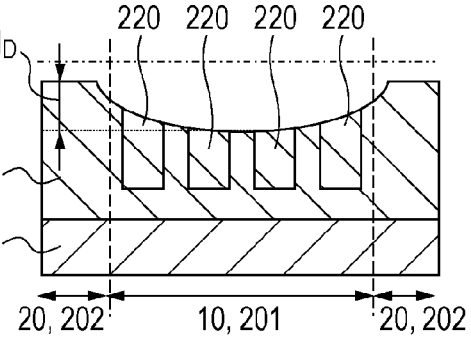
Figure 4A:
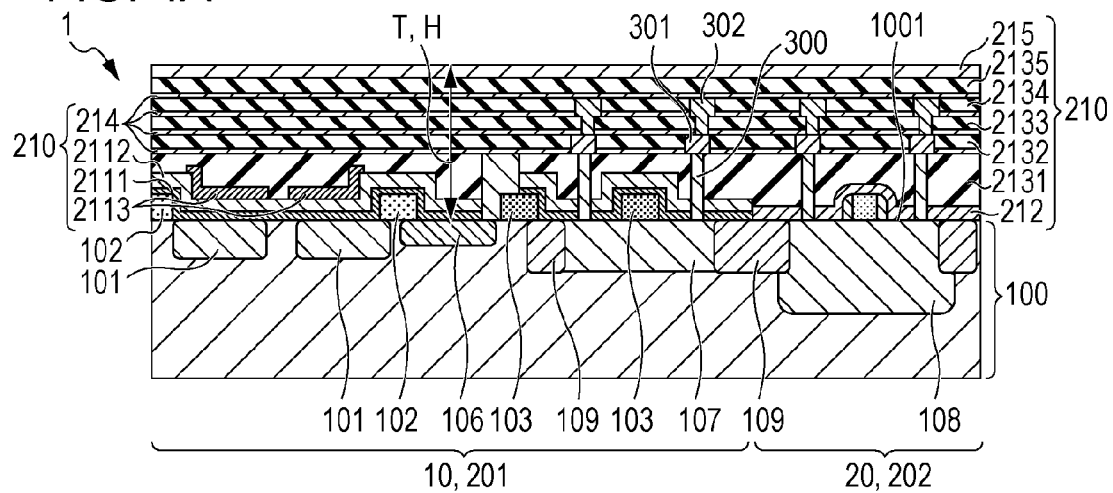
FIGS. 4A to 4C illustrate a method of manufacturing an image pickup device.
Figure 4B:
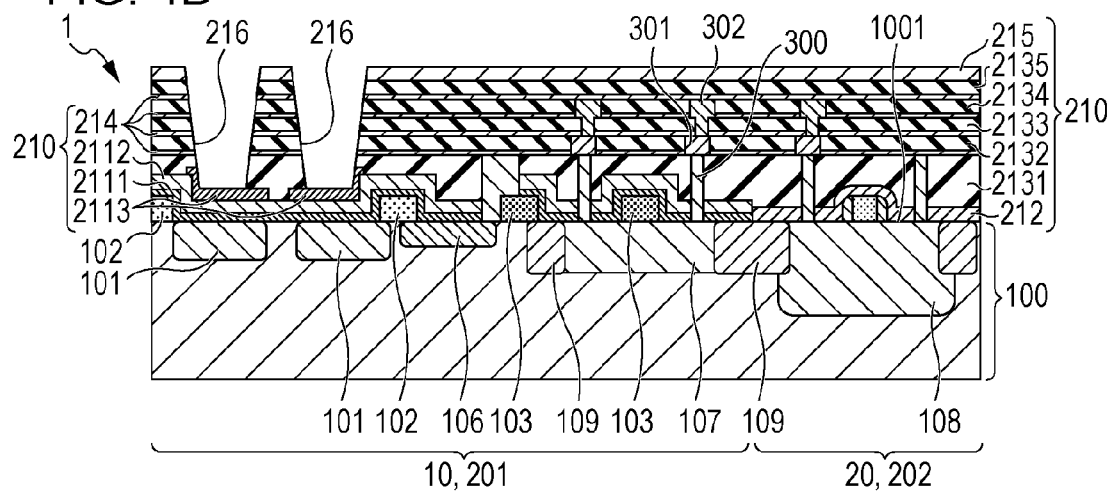
Figure 4C:
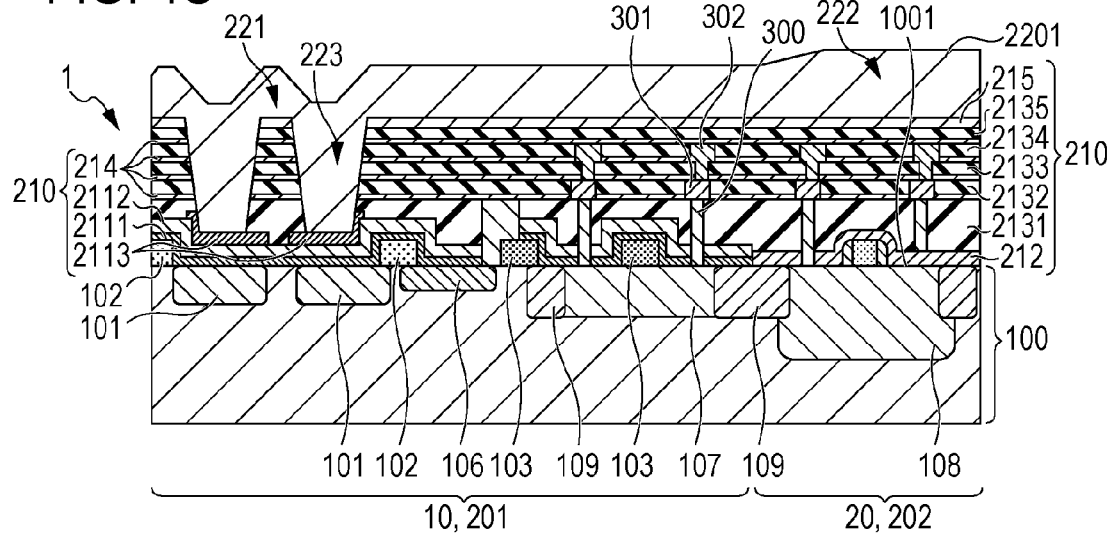
Figure 6:
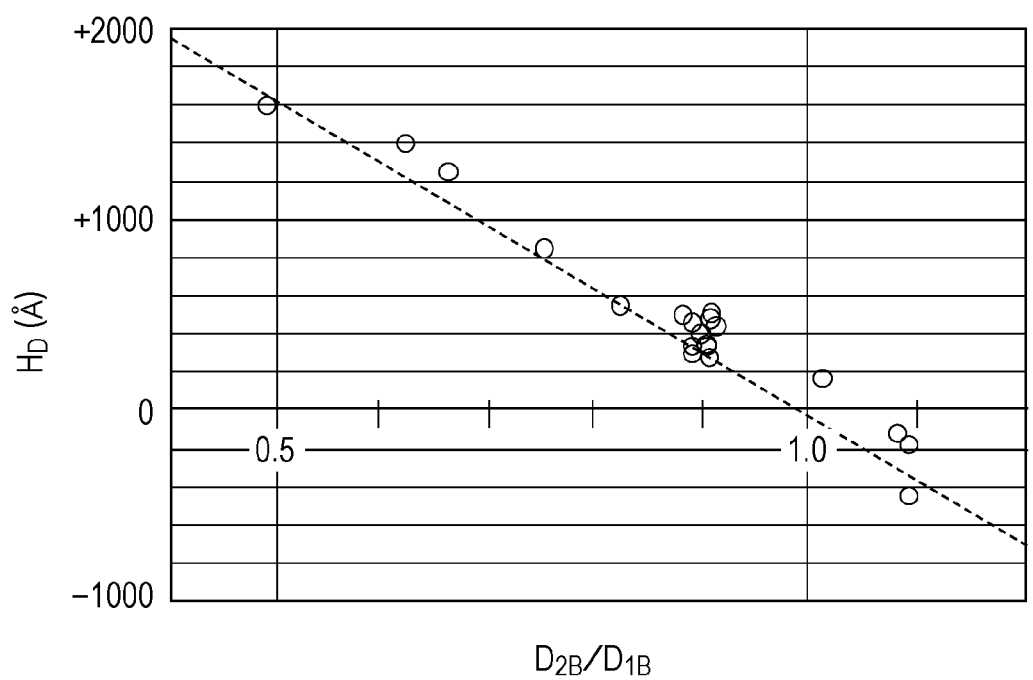
FIG. 6 is a graph illustrating the method of manufacturing the image pickup device.

FIG. 6 is a graph illustrating the relationship between the removal amount in the etching process and the difference in level in the polishing process. The vertical axis in the graph of FIG. 6 represents the height difference $H_D$ between the surface of the filling member 2203 in the image pickup region 10 and the surface of the base film 210 (surface of the reference layer 215) in the peripheral region 20 at the time when the reference layer 215 in the peripheral part 202 of the base film 210 is exposed in the step e. In the present example, the height difference is measured by using an atomic force microscope (AFM). Alternatively, the height difference can be measured by, for example, sectional observation with a scanning electron microscope (SEM). The horizontal axis represents the size relationship $D_{2B}/D_{1B}$ between the amount per unit area of the first part 221 and the amount per unit area of the second part 222 after the etching process has been performed. A value greater than 0 in the vertical axis indicates that the filling member 2203 remains above the reference layer 215 as illustrated in, for example, FIG. 2E. A value smaller than 0 in the vertical axis indicates that the light guiding part 201 and the light guiding members 220 are recessed relative to the peripheral part 202 as illustrated in FIG. 3F. As can be understood from FIG. 6, the graph illustrates a tendency in which, with the $D_{2B}/D_{1B}=1.0$ as a boundary, the filling member 2203 remains on the light guiding part 201 at the time the peripheral part 202 is exposed when $D_{2B}/D_{1B} < 1.0$. Since $D_{2B}/D_{1B}$ is significant to the first decimal place, when $D_{2B}/D_{1B}$ is equal to or greater than 0.95 and smaller than 1.05, $D_{2B}$ and $D_{1B}$ can be regarded as equal to each other. In comparison with damage to the light guiding part 201, damage to the peripheral part 202 is allowable. When $D_{2B}/D_{1B} \geq 0.5$, the height difference does not practically cause problems. When the $D_{2B}/D_{1B} \geq 0.7$, a very high flatness can be ensured such that unevenness in color or the like does not occur even in consideration of the formation of the color filters and the like to be performed later.

Typically, a plurality of the image pickup devices 1 are formed on a semiconductor wafer. The peripheral regions 20 of the image pickup devices 1 are arranged adjacent to one another with scribe regions therebetween. Referring to FIG. 1A, the peripheral region 20 is defined by the two-dot chain line. A region between the solid line that indicates the outline of the image pickup device 1 and the two-dot chain line is a scribe region for obtaining the plurality of image pickup devices 1 from a semiconductor wafer. By dividing (dicing) the semiconductor wafer along the scribe regions, the plurality of image pickup devices 1 (chips) can be obtained. The area of each image pickup device 1 (the area of the chip) is represented by $S_1+S_2$. Although there may be a slight difference between central and peripheral portions of the above described semiconductor wafer, the relationship between the image pickup region 10 and the peripheral region 20, and the relationships among the corresponding portions such as the light guiding part 201, the peripheral part 202, the first part 221, and the second part 222 can be completely established within a region allocated for each image pickup device 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-174844 filed Aug. 7, 2012, which is hereby incorporated by reference herein in its entirety.

What is claimed is:

1. A method of manufacturing an image pickup device that includes a substrate and a plurality of light guiding members, the substrate having an image pickup region and a peripheral region, a plurality of photoelectric conversion portions arranged in the image pickup region, the peripheral region surrounding the image pickup region, the plurality of light guiding members being provided so as to correspond to the respective photoelectric conversion portions on the image pickup region, the method comprising the steps of:

forming a filling member such that the filling member covers a light guiding part and a peripheral part provided in a film, the light guiding part being positioned on the image pickup region and having a plurality of openings that correspond to the respective photoelectric conversion portions, the peripheral part being positioned on the peripheral region, the filling member filling in the plurality of openings;

processing the filling member; and forming the plurality of light guiding members by a polishing process performed on the filling member so that the light guiding part is exposed, the forming of the plurality of light guiding members being performed after the processing of the filling member has been performed, the plurality of light guiding members being part of the filling member and being disposed in the plurality of openings, wherein, at a first point of time, which is between the forming of the filling member and the processing of the filling member, and at a second point of time, which is between the processing of the filling member and the forming of the plurality of light guiding members, the filling member has a first part positioned on the light guiding part and separated from the image pickup region by a base distance, a second part positioned on the peripheral part and separated from the peripheral region by the base distance, and a third part that is positioned between the first part and the image pickup region and fills in the plurality of openings, and wherein, when $S_1$ is an area of the image pickup region, $S_2$ is an area of the peripheral region, $V_{1A}$ is a volume of the first part at the first point of time, $V_{2A}$ is a volume of the second part at the first point of time, $V_{1B}$ is a volume of the first part at the second point of time, and $V_{2B}$ is a volume of the second part at the second point of time, the following relationships, $V_{1A}/S_1 < V_{2A}/S_2$ and $V_{1B}/S_1 \geq V_{2B}/S_2$, are satisfied.

2. The method according to claim 1, wherein $S_1 < S_2$ is satisfied.

3. The method according to claim 1, wherein $V_{2B}/S_2 \geq V_{1B}/2S_1$ is satisfied.

4. The method according to claim 1, wherein the film is a multilayer film including a layer formed of a material, a polishing rate of which in the polishing process is less than a polishing rate of the filling member in the polishing process.

5. The method according to claim 4, wherein the polishing process is completed in a state in which the layer is exposed.

6. The method according to claim 4, wherein the layer is an uppermost layer of the film.

7. The method according to claim 4, wherein the polishing process is a chemical mechanical polishing process using silica slurry, the filling member is formed of silicon nitride, and the layer is formed of a carbon-containing silicon oxide or a carbon-containing silicon nitride.

8. The method according to claim 1, wherein, in the forming of the plurality of light guiding members, the peripheral part is exposed before the light guiding part is exposed.

9. The method according to claim 1, wherein the film has an opening in the peripheral part and the filling member has a fourth part that is positioned between the second part and the peripheral region and fills in the opening of the peripheral part.

10. The method according to claim 1, wherein the plurality of light guiding members are arranged at an interval equal to or less than 2 μm.

* * * * *